United States Patent
Rao

(10) Patent No.: US 9,286,260 B2
(45) Date of Patent: Mar. 15, 2016

(54) SERIAL-TO PARALLEL CONVERTER USING SERIALLY-CONNECTED STAGES

(71) Applicant: Kool Chip, Inc., San Jose, CA (US)

(72) Inventor: Venkata N. S. N. Rao, Fremont, CA (US)

(73) Assignee: SOCTRONICS, INC., Santa Clara, CA (US)

( * ) Notice: Subject to any disclaimer, the term of this patent is extended or adjusted under 35 U.S.C. 154(b) by 332 days.

(21) Appl. No.: 13/851,767

(22) Filed: Mar. 27, 2013

(65) Prior Publication Data

US 2014/0298075 A1    Oct. 2, 2014

(51) Int. Cl.
*G06F 13/12* (2006.01)
*G06F 1/04* (2006.01)
*H03M 9/00* (2006.01)
*G06F 13/42* (2006.01)

(52) U.S. Cl.
CPC ............. *G06F 13/4291* (2013.01); *H03M 9/00* (2013.01)

(58) Field of Classification Search
CPC ............................ G06F 13/4291; H03M 9/00
See application file for complete search history.

(56) References Cited

U.S. PATENT DOCUMENTS

| | | | | |
|---|---|---|---|---|
| 5,055,842 A | * | 10/1991 | Mueller | 341/100 |
| 5,721,545 A | * | 2/1998 | Poplevine | 341/100 |
| 6,373,414 B2 | * | 4/2002 | Koga et al. | 341/100 |
| 6,768,431 B2 | * | 7/2004 | Chiang | 341/100 |
| 6,985,096 B1 | * | 1/2006 | Sasaki et al. | 341/100 |
| 7,253,754 B2 | * | 8/2007 | Takeuchi et al. | 341/100 |
| 2006/0158941 A1 | * | 7/2006 | Kang | 365/189.05 |
| 2010/0014601 A1 | * | 1/2010 | Mo et al. | 375/260 |
| 2012/0154186 A1 | * | 6/2012 | Hassan | 341/100 |

* cited by examiner

*Primary Examiner* — Henry Tsai
*Assistant Examiner* — Jing-Yih Shyu
(74) *Attorney, Agent, or Firm* — Venture Pacific Law, PC

(57) ABSTRACT

A method for converting serial data having a certain word size to parallel data, comprises the steps of: generating segments from the serial data using serially-connected stages, wherein the segments have a predetermined bit size; storing each of the segments into a selectively turned-on flip-flop of a final stage, wherein the final stage is serially connected to the stages, wherein the final stage has a plurality of flip-flops and each of the flip-flops has a bit size equaling to the bit size of the segments; and outputting the stored segments in parallel from the final stage.

13 Claims, 4 Drawing Sheets

SERIAL-TO PARALLEL CONVERTER USING SERIALLY-CONNECTED STAGES

FIELD OF INVENTION

This invention generally relates to a serial-to-parallel converter and, in particular, to a serial-to-parallel converter for converting a serial data word of any word size into a parallel data word.

BACKGROUND

Serial-to-parallel converters are used across various computing devices and for various applications. For instance in a peripheral component interconnect express ("PCIe") serial interface, double data rate data is inputted to a receiver of the PCIe. The receiver converts the double data rate data to a parallel word of different widths.

Typically, when an input word is converted from serial data to parallel data, a serial input signal for the input word is stored in a shift register through successive shifting of the input signal. When the input word of the serial input signal has been stored in the shift register, the whole stored input word is transferred at one time to a buffer register having bit positions corresponding to those of the shift register. The contents of the buffer register, representing the bits of the input word, are outputted in parallel. Thereby, the serial input word is outputted in parallel. The serial-to-parallel converter implemented in this manner consumes large amounts of power in comparison to other serial-to-parallel converter techniques.

Another typical serial-to-parallel converter ("SPC") uses a tree-like circuit having several stages for storing serial bits in multiple increments of 2 bits. The first stage can store 2 bits from the serial data word. The first stage outputs the 2 bits to a second stage that stores 4 bits from the first stage. The next stage can store 8 bits from the second stage. This process continues in the subsequent stages until 2N bits are stored for output in parallel. Unfortunately, such serial-to-parallel converter has the problem that the circuit size becomes greater than a typical shift-register-type converter when the number of bits to be outputted in parallel increases. Also, the number of stages can dramatically increase as the number of bits to be outputted in parallel increases, thereby, increasing the latency which is a function on the number of stages of the SPC. Furthermore, the SPC cannot be adjusted for input words that are not exactly 2N bits in word size.

Therefore, there exists a need for a novel SPC that has low latency and a predefined number of stages for converting a serial data word to a parallel word.

SUMMARY OF INVENTION

An object of this invention is to provide a low power serial-to-parallel converter.

Another object of this invention is to provide a serial-to-parallel converter that has low latency for converting serial data to parallel data.

Yet another object of this invention is to provide a serial-to-parallel converter that supports multiple word widths.

Briefly, the present invention discloses a method for converting serial data having a certain word size to parallel data, comprising the steps of: generating segments from the serial data using serially-connected stages, wherein the segments have a predetermined bit size; storing each of the segments into a selectively turned-on flip-flop of a final stage, wherein the final stage is serially connected to the stages, wherein the final stage has a plurality of flip-flops and each of the flip-flops has a bit size equaling to the bit size of the segments; and outputting the stored segments in parallel from the final stage.

An advantage of this invention is that a low power serial-to-parallel converter is provided.

Another advantage of this invention is that a serial-to-parallel converter that has low latency for converting serial data to parallel data is provided.

Yet another advantage of this invention is that a serial-to-parallel converter that supports multiple word widths is provided.

DESCRIPTION OF THE DRAWINGS

The foregoing and other objects, aspects, and advantages of the invention can be better understood from the following detailed description of the preferred embodiment of the invention when taken in conjunction with the accompanying drawings in which.

DETAILED DESCRIPTION OF THE PREFERRED EMBODIMENTS

In the following detailed description of the embodiments, reference is made to the accompanying drawings, which form a part hereof, and in which is shown by way of illustration of specific embodiments in which the present invention may be practiced.

Generally, a method for converting serial data having a certain word size to parallel data, comprises the steps of: generating segments from the serial data using serially-connected stages, wherein the segments have a predetermined bit size; storing each of the segments into a selectively turned-on flip-flop of a final stage, wherein the final stage is serially connected to the stages, wherein the final stage has a plurality of flip-flops and each of the flip-flops has a bit size equaling to the bit size of the segments; and outputting the stored segments in parallel from the final stage.

Figure 1:
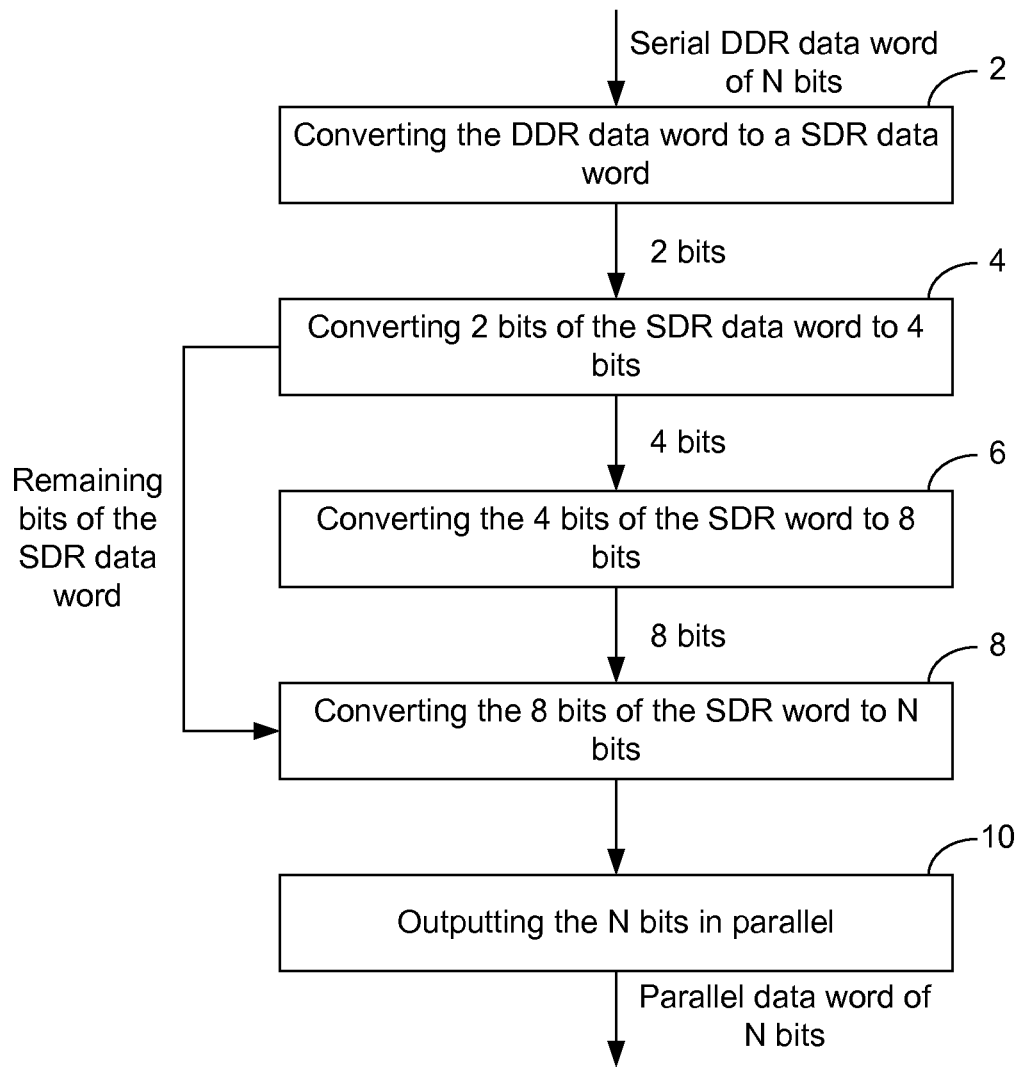
FIG. 1 illustrates a process flow of the present invention for converting a serial data word to a parallel data word.

FIG. 1 illustrates a process flow of the present invention for converting a serial data word to a parallel data word. An input word of serial double data rate ("DDR") data is inputted to a SPC of the present invention. The input word is received bit by bit according to an external clock signal sclk. The received bits of the input word can be received and processed in various stages for parallel output. The process flow of the bits can take two paths depending on the number of remaining bits of the input word to be processed by the SPC.

Generally, in a first path, the bits of the input word flow through serially-connected stages for holding and storing bits of the input word. The stored bits are eventually loaded into a final stage in segments of a predetermined bit size. For instance, every 8 bits of the input word, e.g., a segment of the input word, can be outputted to the final stage of the SPC. When all the bits of the serial input word, e.g., all the segments of the input word, are loaded into the final stage, the data in the final stage can be outputted in parallel by a shadow register along with a matched clock signal.

A second path can be for remaining bit(s), e.g., the last segment of the input word, that are less than the predetermined segment size. For such remaining bit(s), the remaining bit(s) are routed pass the intermediary stages of the SPC since it can be more efficient to send the remaining bits of the input word directly from one stage to the final stage. Thus, the additional latency caused by the intermediary stages is entirely eliminated since the intermediary stages may not be used for the remaining bit(s) of the input word. Further details of a process flow for a SPC of the present invention are described in more detail below with reference to FIG. 1.

Referring to FIG. 1, the DDR data word is converted to a single data rate ("SDR") data word in step 2. Every two bits of the SDR data word is transmitted to a first stage of the SPC that converts two bits to four bits in step 4 by holding and storing four bits of the input word for output to a second stage.

During conversion in the first stage, four consecutive bits of the SDR data word are received in two bit increments from the conversion of the DDR data word to the SDR data word. Each of the received bits is stored in flip-flops of the first stage. Once four bits of the SDR data word are stored in the flip-flops, the four bits are transmitted to the second stage of the SPC that converts four bits to eight bits in step 6 by holding and storing eight bits of the input word for output to a final stage.

During conversion in the second stage, eight consecutive bits of the SDR data word are received in four bit increments from the first stage and are stored in flip-flops of the second stage. Once eight bits of the SDR data word are stored in the flip-flops of the second stage, the eight bits are transmitted to the final stage of the SPC that converts eight bits to N bits in step 8.

During conversion in the last stage, all the bits of the SDR data word, i.e., N bits, are received in eight-bit increments (or less if the SDR data word size is not a multiple of eight) from the second stage, and are stored in flip-flops. Once all N bits of the SDR data word are stored in the flip-flops of the final stage, the N bits can be outputted in parallel in step 10. Thereby, the serial input word of N bits is converted to a parallel data word.

If the remaining bits of the SDR data word is less than 8 bits, then the remaining bits can be routed from the first stage to the last stage. Thereby, the second stage does not process the remaining bits and the overall latency is decreased. In alternative embodiments of a SPC of the present invention, the remaining bits may also flow through each stage sequentially.

Figure 2:
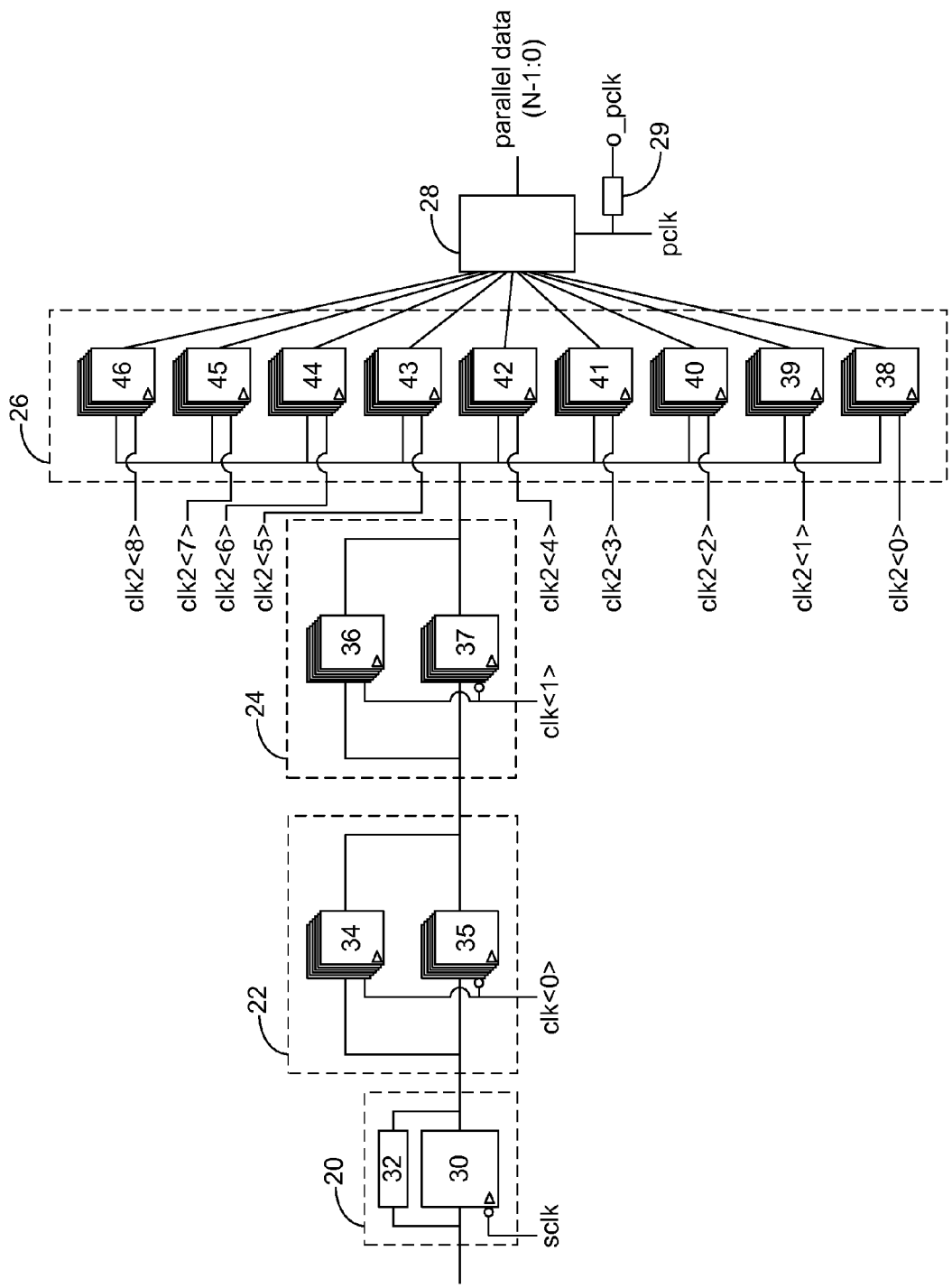
FIG. 2 illustrates a block diagram of a serial-to-parallel converter of the present invention.

FIG. 2 illustrates a block diagram of a serial-to-parallel converter of the present invention. A SPC of the present invention comprises a bit converter 20 for converting DDR data to SDR data, a first stage 22 for converting 2 bits to 4 bits, a second stage 24 for converting 4 bits to 8 bits, and a third stage 26 for converting 8 bits to N bits, and a shadow register 28 for outputting the N bits in parallel along with a clock signal o_pclk. The shadow register 28 can be flip-flops that are triggered by the generated clock signal pclk.

In this example, the third stage is the final stage of the serially-connected stages. However, is it to be noted that any number of stages can be serially connected for holding and storing bits of an input word in an increasing manner for each subsequent stage. To aid in the understanding of the invention, the present example presents three serially-connected stages.

The bit converter 20 comprises a latch 30 and a buffer 32. The latch 30 latches the DDR data available on a positive phase of the clock signal sclk. The buffer 32 matches the delay introduced by the latch 30 and presents the incoming data along with the latched data to the first stage 22. Thus, the inputted DDR data is converted to SDR data and outputted in a 2 bit fashion to the first stage 22.

The first stage 22 comprises flip-flops 34 and 35 for storing up to 4 bits of the input word. The first stage 22 receives 2 bits of the input word for storing in the flip-flops 34 on the rising edge of a clock signal clk<0> and 2 bits of the input word for storing in the flip-flops 35 on the falling edge of the clock signal clk<0>. The clock signal clk<0> is half the frequency of the clock signal sclk. Once 4 bits of the input word are stored, the first stage outputs those stored 4 bits to the second stage 24. The first stage 22 receives a next 4 bits of the input word in 2 bit increments from the bit converter 20. This process for the first stage 22 of storing 4 bits of the input word, transmitting those stored bits to the second stage 24, and receiving additional bits of the input word to store continues until all the bits of the input word are processed by the SPC for parallel output.

The second stage 24 comprises flip-flops 36 and 37 for storing up to 8 bits of the input word. The second stage 24 receives 4 bits of the input word for storing in the flip-flops 36 on the rising edge of a clock signal clk<1> and 4 bits of the input word for storing in the flip-flops 37 on the falling edge of the clock signal clk<1>. The frequency of the clock signal clk<1> is half the frequency of the clock signal clk<0> and a fourth of the frequency of the clock signal sclk.

Once 8 bits of the input word are stored, the second stage 24 outputs those stored 8 bits to a third stage 26. The second stage 24 receives a next 8 bits of the input word in 4 bit increments from the first stage 22. This process for the second stage 24 of storing 8 bits of the input word, transmitting those stored bits to the third stage 26, and receiving additional bits of the input word to store continues until all the bits of the input word are processed by the SPC for parallel output.

The third stage 26 comprises flip-flops 38-46 for storing N bits of the input word. The third stage 26 receives a segment of 8 bits of the input word for storing in the flip-flops 38-46 according to clock signals clk2<8:0>. The third stage receives continuous 8-bit (or less) segments of the input word from the second stage 24 (or the first stage for the remaining bits of the input word). The segments are latched to the flip-flops 38-46 according to the clock signals clk2<8:0>, such that the bits of the input word can be packed into the flip-flops 38-46 for parallel output.

The clock signals clk2<8:0>, include clk2<0>, clk2<1>, clk2<2>, clk2<3>, clk2<4>, clk2<5>, clk2<6>, clk2<7>, and clk2<8>. The clock signals clk2<8:0> provide the latching timing for the respective flip-flops 38-46 to which the clock signals clk2<8:0> are inputted. For instance, the clock signal clk2<0> provides the timing for latching data from the second stage 24 to the flip-flop 38; the clock signal clk2<1> provides the timing for latching data from the second stage 24 to the flip-flop 39; the clock signal clk2<2> provides the timing for latching data from the second stage 24 to the flip-flop 40; and so forth with the additional clock signals clk2<8:3>.

The number of flip-flops 38-46 that are needed for parallel output of the input word is dependent on the word size of the input word and the bit storage size of the flip-flop. For instance, if the word size is 16 bits and each of the flip-flops 38-46 can store 8 bits, then only two of the flip-flops 38-46 (e.g., the flip-flops 38 and 39) are selectively turned on. Thus, the selected ones of the flip-flops, i.e., the flip-flops 38 and 39, can be activated to store the 16 bit input word. (See FIG. 4 for a timing diagram of the various signals of a SPC of the present invention for converting a 16 bit input word of serial DDR data to parallel data.) The other seven flip-flops 40-46 can be deactivated by simply keeping the clock signals clk2<8:2> low or at another deactivated signal state. The activated flip-flops can be referred to as the selected ones of the flip-flops and the deactivated flip-flops can be referred to as non-selected ones of the flip-flops.

For the activated flip-flops 38 and 39, the frequency of each of the clock signals clk2<1:0> can be the frequency of the clock signal sclk divided by the word size of the input data. The clock signals clk2<1:0> are high for 8 unit intervals ("UI") to latch 8 bits from the second stage 24 to the respective flip-flops 38 and 39. The clock signals clk2<1:0> alternate being in a high state. When the clock signal clk2<0> is in a high state to latch 8 bits from the second stage 24 to the flip-flop 38, clk2<1> is in a low state. After 8 UI, the clock signal clk2<0> transitions to a low state and the clock signal clk2<1> transitions to a high state for 8 UI to latch a next 8 bits from the second stage 24 to the flip-flops 39. Thus, for a 16 bit input word, the flip-flops 38 and 39 are activated in alternating fashion to store 8 bit segments of the input word for output.

This method can be extended for any word size for the input word. For instance, if the word size for the input word was 72 bits, the flip-flops 38-46 can all be used in alternating fashion to store all 72 bits of the input word in 8 bit increments from the second stage 24. The clock signals clk2<8:0> can allow for one of the flip-flops 38-46 to be activated at any one time to store one of the 8 bit increments from the second stage 24. If the word size of the input word exceeds 72 bits, then additional flip-flops and clock signals for those flip-flops can be added and utilized as needed to support the word size of the input word. Alternatively, each of the flips-flops 38-46 do not need to be fully utilized to operate the SPC. For example, if the word size of the input word is 10 bits, then 8 bits of the input word can be stored in the flip-flop 38 and the remaining 2 bits of the input word can be stored in the flip-flop 39. The clocks signals clk2<2:0> can be adjusted accordingly for such case.

Referring to FIG. 2, once N bits of the input word are stored in the flip-flops 38-46, the N bits of the input word are outputted in parallel via a shadow register 28. A clock signal o_pclk, which is based on the clock signal pclk, is outputted with the parallel data from a match buffer 29 to provide a timing for the parallel data.

In alternative embodiments of the invention (not shown in FIG. 2), the first stage 22 can output remaining bits of the input word (e.g., 7 bits or less) of the input word directly to the third stage 26, bypassing the second stage 24. Since the second stage is bypassed for the last segment of the input word, latency can be minimized.

The SPC of the present invention is described with respect to embodiments in which DDR data is inputted to the bit converter 20. However, the SPC of the present invention can also handle SDR input data to be output in parallel. In such cases, SDR data is inputted to the bit converter 20. The clock signal sclk for the SDR data is halved in frequency and inputted to the bit converter 20 in order to capture 2 bits of the SDR data for output to the first stage of the SPC. The remaining operation of the SPC is similar to the SPC example given above for an input word of DDR data.

Figure 3:
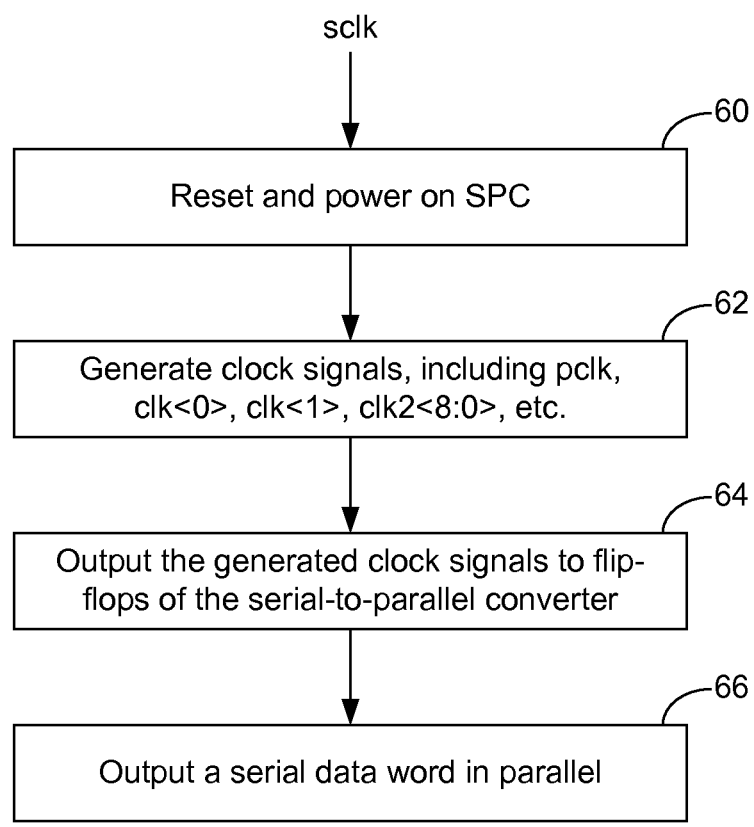
FIG. 3 illustrates a flow chart for generating various clock signals for a serial-to-parallel converter of the present invention.

FIG. 3 illustrates a flow chart for generating various clock signals for a serial-to-parallel converter of the present invention. Clock signals of the SPC of the present invention can follow the following process. Generally, an external clock signal sclk for the input word of serial DDR data is inputted to a SPC of the present invention. The SPC is first powered on and various clock signals of the SPC are reset in step 60. Next, the SPC uses the clock signal sclk to generate other clock signals in step 62, including pclk, clk<0>, clk<1>, and clk2<8:0> for operating the SPC.

The clock signal sclk is externally provided to the SPC to give the timing of the bits of the input word. The clock signal clk<0> for the first stage is half the frequency of the clock signal sclk. A rising edge of the clock signal clk<0> is aligned to one of the rising edges of the clock signal sclk. The clock signal clk<1> for the second stage is half the frequency of the clock signal clk<0>. A falling edge of the clock signal clk<1> is aligned to one of the rising edges of the clock signal sclk. The clock signals clk2<8:0> for the third stage are half the frequency of the clock signal clk<1>. A transition point for each of the clock signals clk2<8:0> is aligned to one of the rising edges of the clock signal sclk. The pclk signal is half the frequency of the clk2<8:0> and is aligned with the parallel output of the data for the input word.

The generated clock signals are outputted to the SPC in step 64. As noted above, the clock signals can be used to latch data to the respective flip-flops. Once the N bits of the input word are stored in the final stage of the SPC, the input word can be outputted in parallel in step 66.

Figure 4:
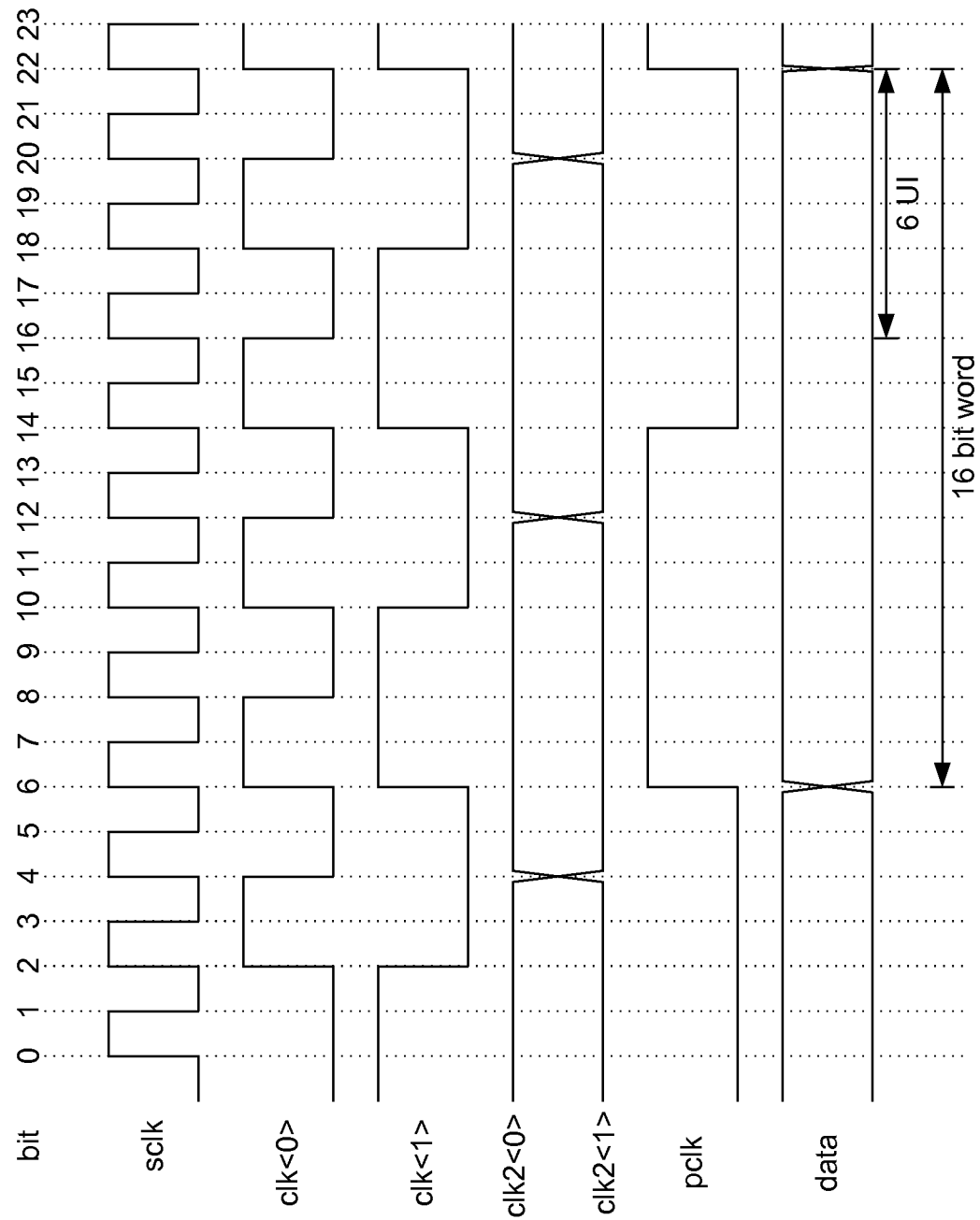
FIG. 4 illustrates a timing diagram for various signals of a serial-to-parallel converter of the present invention.

FIG. 4 illustrates a timing diagram for various signals of a serial-to-parallel converter of the present invention. The timing diagram provides the relative timing of various signals for a SPC of the present invention. For this example, the SPC converts a 16 bit input word of serial DDR data to parallel data. The various signals of the SPC include the bit sequence of the input word, clock signals (e.g., sclk, clk<1>, etc.), and the data signaling for the parallel output of the input word. The various signals are aligned along an axis to show the relative timing of these signals. The frequencies of each of the various signals are stated in the description of above.

With respect to the latency for this example, if the first bit of a 16 bit input word is provided at bit sequence 0, the input word can be outputted as parallel data by the SPC at bit sequence 22. This gives about a 6 UI latency between when the last bit of the input word is received and when the parallel data is outputted. Since the SPC of the present invention has a set number of stages (e.g., a first, second, and third stage), the latency remains constant regardless of the word size of the input word.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

I claim:

1. A method for converting serial data having a certain word size to parallel data, comprising the steps of:
   generating segments from the serial data using serially-connected stages, wherein the segments have a predetermined bit size;
   storing each of the segments into a selectively turned-on flip-flop of a final stage, wherein the final stage is serially connected to the stages, wherein the final stage has a plurality of flip-flops, wherein each of the flip-flops has a bit size equaling to the predetermined bit size, wherein the segments are latched to the flip-flops of the final stage according to generated clock signals, wherein selected ones of the flips-flops are activated by the generated clock signals to store up to the certain word size, and wherein non-selected ones of the flip-flops are deactivated by the generated clock signals; and
   outputting the stored segments in parallel.

2. The method of claim 1 wherein the predetermined bit size is smaller than the certain word size.

3. The method of claim 1 wherein the serial data is received according to an external clock signal and wherein the generated clock signals are generated as a function of the external clock signal and the certain word size.

4. The method of claim 3 wherein the generated clock signals have a predefined frequency and wherein the predefined frequency is equal to the frequency of the external clock signal divided by the certain word size.

5. The method of claim 1 wherein if remaining bits of the serial data to be processed by the stages is less than the predetermined bit size of the segments, then a selected one of the stages outputs directly to the final stage, and wherein one or more intermediary stages bypass processing the remaining bits.

6. A serial-to-parallel converter for converting serial data having a certain word size to parallel data, comprising:
    serially-connected stages, wherein the stages generate segments from the serial data and wherein the segments have a predetermined bit size; and
    a final stage, wherein the final stage comprises flip-flops, wherein the final stage is serially connected to the stages, wherein each of the segments is stored into a selected one of the flip-flops, wherein each of the flip-flops has a bit size equaling to the predetermined bit size, and wherein the stored segments are outputted in parallel, wherein the segments are latched to the flip-flops of the final stage according to generated clock signals, wherein selected ones of the flips-flops are activated by the generated clock signals to store up to the certain word size, and wherein non-selected ones of the flip-flops are deactivated by the generated clock signals.

7. The serial-to-parallel converter of claim 6 wherein the predetermined bit size is smaller than the certain word size.

8. The serial-to-parallel converter of claim 6 wherein the serial data is received according to an external clock signal and wherein the generated clock signals are generated as a function of the external clock signal and the certain word size.

9. The serial-to-parallel converter of claim 8 wherein the generated clock signals have a predefined frequency and wherein the predefined frequency is equal to the frequency of the external clock signal divided by the certain word size.

10. The serial-to-parallel converter of claim 6 wherein if remaining bits of the serial data to be processed by the stages is less than the predetermined bit size of the segments, then a selected one of the stages outputs directly to the final stage, and wherein one or more intermediary stages bypass processing the remaining bits.

11. A method for converting serial data having a certain word size to parallel data, comprising the steps of:
    generating segments from the serial data using serially-connected stages, wherein the segments have a predetermined bit size;
    storing each of the segments into a selectively turned-on flip-flop of a final stage, wherein the final stage is serially connected to the stages, wherein the final stage has a plurality of flip-flops, and wherein each of the flip-flops has a bit size equaling to the predetermined bit size, wherein selected ones of the flips-flops are activated by the generated clock signals to store up to the certain word size and wherein non-selected ones of the flip-flops are deactivated by the generated clock signals; and
    outputting the stored segments in parallel,
    wherein the predetermined bit size is smaller than the certain word size,
    wherein the segments are latched to the flip-flops of the final stage according to generated clock signals, and
    wherein the serial data is received according to an external clock signal and wherein the generated clock signals are generated as a function of the external clock signal and the certain word size.

12. The method of claim 11 wherein the generated clock signals have a predefined frequency and wherein the predefined frequency is equal to the frequency of the external clock signal divided by the certain word size.

13. The method of claim 11 wherein if remaining bits of the serial data to be processed by the stages is less than the predetermined bit size of the segments, then a selected one of the stages outputs directly to the final stage, and wherein one or more intermediary stages bypass processing the remaining bits.

* * * * *